United States Patent [19]

Briska et al.

[11] 4,109,030

[45] Aug. 22, 1978

[54] METHOD FOR THERMALLY OXIDIZING SILICON

[75] Inventors: Marian Briska; Ewald Eisenbraun, both of Boeblingen, Fed. Rep. of Germany

[73] Assignee: International Business Machines Corporation, Armonk, N.Y.

[21] Appl. No.: 718,747

[22] Filed: Aug. 30, 1976

[30] Foreign Application Priority Data

Nov. 10, 1975 [DE] Fed. Rep. of Germany ....... 2550371

[51] Int. Cl.$^2$ .............................................. C23C 11/00
[52] U.S. Cl. ................................. 427/93; 427/248 C; 427/255
[58] Field of Search .............. 427/255, 93, 399, 248 C

[56] References Cited

U.S. PATENT DOCUMENTS

| | | | |
|---|---|---|---|
| 3,446,659 | 5/1969 | Wisman et al. | 427/93 |
| 3,903,325 | 9/1975 | Horiuchi | 427/255 X |
| 4,034,130 | 7/1977 | Briska et al. | 427/248 C |

OTHER PUBLICATIONS

Kriegler et al., "The Effect of HCl . . .", *J. Electrochem Soc.* vol. 119, pp. 388–391 (3–1972).

*Primary Examiner*—Harry J. Gwinnell

[57] ABSTRACT

A method of thermally oxidizing heated silicon substrates with a mixture of oxygen and nitrosyl chloride in an inert gas diluent such as nitrogen. The ratio of oxygen to nitrosyl chloride is illustratively in the range of about 1:1 to about 20:1.

9 Claims, No Drawings

METHOD FOR THERMALLY OXIDIZING SILICON

Field of the Invention

This invention relates to the processing of semiconductor materials and, more particularly, to the thermal oxidation of silicon substrates.

Description of the Prior Art

The manufacture of monolithic circuits (e.g. field effect transistors) has need to employ oxidation operations during various stages of fabrication to form silicon dioxide. For example, one of the first operations in the fabrication of devices normally requires the formation of a silicon dioxide layer on a semiconductor substrate such as a slightly p-doped silicon wafer. For fabrication of field effect transistors, photolithographic techniques are employed for forming source and drain diffusion windows above portions of the wafer in which N+ source and drain regions are to be formed by diffusion of appropriate impurities, through the windows, such as phosphorous. After completion of the source-drain diffusion, the wafer is subjected to an oxidation operation to form a thick oxide layer for passivation of the wafer and insulation with respect to subsequently formed conductor (e.g. aluminum) patterns. Since the gate oxide is subject to very stringent requirements, the thick silicon oxide layer is etched off over the gate area, and new thin oxide grown thereover, as by a dry oxidation step. After opening of contact holes, to the source and drain regions, the wafer is coated with a coating of a conductor, such as aluminum, which is selectively removed conventionally by photolithographic techniques, into the required conductor pattern. For final passivation, a quartz layer is applied, as by sputtering, over the conductor and the remainder of the wafer, with subsequent formation of contact holes, through the quartz, for access to the underlying metallization.

Frequently, oxidation steps such as the first two discussed above, are required to provide silicon dioxide thicknesses of the order of 5000 Angstroms. Heretofore, wet oxidation techniques were employed at temperatures of about 1000° C to produce layers in such thickness, within reasonable times. For example, utilizing the teachings on page 2664 of the IBM Technical Disclosure Bulletin, Vol. 17, No. 9, February 1975, a 3800 Angstrom thick silicon dioxide layer can be grown in pure water vapor within 60 minutes at a temperature of 1000° C and a gas flow rate of 5 liters/min. In contrast, under the same conditions of temperature and gas flow but utilizing solely a pure dry oxygen flow, only a 480 Angstrom thick silicon dioxide layer could be grown. It is generally accepted that the wet oxidation permits rapid growth of silicon dioxide on silicon, due to the higher diffusion rate of the water molecules to the silicon-silicon dioxide interface as compared to oxidation in dry oxygen. However, the oxide produced by dry oxidation was characterized with superior properties relative to the oxide obtained by the wet method. The differences in these dry and wet oxidation techniques have led to their combined use in forming thick silicon dioxide layers in a dry-wet-dry process by utilizing the dry oxidation technique before and after a wet oxidation step.

As reported by R. J. Kriegler et al. in the Journal of the Electrochemical Society, page 388, Vol. 119, 1972, and by R. S. Ronen et al. on page 747 of the same volume, the silicon dioxide growth rate can be increased by adding a few mole percent of chlorine ($Cl_2$) or hydrogen chloride (HCl) to a dry oxygen flow, with the electrical stability of the resultant oxide layers also significantly improved by the gettering effect of these additives. It was found that the use of chlorine involves its reaction with any metal ions in quartz reactor tubes as well as with any metal ions on the surface of the wafers to form highly volatile chlorides which are carried out of the system in the gas flow. Further, any chlorine entrained in the growing oxide layer produces negatively charged states which, for example, lead to a reduction in the absolute value of the flatband voltage. Similar effects are obtained with the use of hydrogen chloride as a chlorine source. However, the use of chlorine and hydrogen chloride is characterized with the disadvantages by the high chemical activity and corrosive properties. Also, hydrogen chloride reacts with oxygen, at oxidation temperature, to form water which is undesirable.

Summary of the Invention

It is an object of this invention to provide a novel and improved method for thermally oxidizing silicon substrates in an oxygen atmosphere which can optionally be diluted with inert gases.

It is another object of this invention to provide a novel and improved method for oxidation of silicon substrates at increased growth rates in a dry oxygen atmosphere.

It is a further object of this invention to provide a novel method for oxidation of silicon to provide oxide coatings having improved breakdown voltage characteristics.

It has now been discovered in accordance with this invention that the foregoing and other objects discussed above can be attained by oxidation of silicon substrates in a reactive atmosphere comprised of a gas mixture containing oxygen and nitrosyl chloride (NOCl) with the preferred, but optional presence, of an inert gas diluent such as nitrogen. Generally, the volume ratio of the oxygen to nitrosyl chloride will be in the range of 1:1 to 20:1; and when an inert gas diluent (e.g. nitrogen) is employed, its ratio to oxygen can be in the range of about 16:1 by volume.

Illustrative of this invention is the oxidation of a silicon wafer at a substrate temperature of 1050° C in a gas flow, through a reaction tube of about 40 $cm^2$ cross-section, comprised of 20 liters of nitrogen/min., 0.22 liter of nitrosyl chloride/min. and 1.3 liters of oxygen/min. (e.g. a 21.52 liter/min. flow of gas mixture comprised of 92.94 vol.% nitrogen, 6.04 vol.% oxygen and 1.02 vol.% nitrosyl chloride).

By means of the method of this invention, in which silicon substrates are oxidized at about 1000° C in a nitrogen diluted gas flow of dry oxygen and nitrosyl chloride, silicon dioxide can be grown at growth rates of 30 Angstroms per minute. In contrast, like oxidation of silicon in the absence of nitrosyl chloride results in formation of silicon dioxide at growth rates of only 1.4 Angstroms per minute. Also, the silicon dioxide layers formed by the mixture of dry oxygen and nitrosyl chloride, in accordance with this invention, contain fewer than $5 \times 10^{10}$ charge carriers/$cm^2$ and is characterized with a high breakdown voltage equivalent to that obtained by oxidation of silicon in a gas mixture of dry oxygen and chlorine.

The high growth rate of silicon dioxide obtained in accordance with this invention is only surpassed by the growth rates of about 70 Angstroms/min. which can typically be obtained by wet oxidation of silicon in water vapor. However, if silicon substrates are oxidized under the same conditions of temperature and gas flow specified above for this invention, in a wet oxygen flow diluted with nitrogen at a volume ratio of 1:16, the maximum growth rate of silicon dioxide obtained is only about 10 Angstroms/min. Also, because of the relatively poor quality of the silicon dioxide layers produced heretofore by these wet methods (e.g. which contain more than $10^{11}$ charge carriers/cm$^2$ and which have lower breakdown voltages), such oxides have found little application for use as protective coatings, diffusion masks, and dielectrics.

The high boiling characteristics of nitrosyl chloride enable more convenient handling as compared to the handling of hydrogen chloride and chlorine heretofore advanced in semiconductor processing. Since nitrosyl chloride has a boiling point of −5.5° C, it can be stored at pressures less than about 2 kiloponds/cm$^2$. This not only permits readily containment of the nitrosyl chloride, but also because of its non-corrosive nature, it permits the use of plastic valve which reduces the risk of introducing metallic impurities in the oxidizing environment within the reaction tube. For these reasons, no extraordinary safety or handling precautions are required for the handling of the nitrosyl chloride.

DESCRIPTION OF THE PREFERRED EMBODIMENTS

The thermal oxidation of silicon substrates, in accordance with this invention utilizing nitrosyl chloride can be carried out in a pure dry oxygen flow, or in an oxygen flow diluted with an inert gas carrier such as nitrogen. When pure dry oxygen is employed alone (e.g. in the absence of an inert carrier gas) with nitrosyl chloride, the flow rates can be either high or low; and where the flow rates are high, the oxygen can also function as a carrier gas.

A significant increase in the growth rate of silicon dioxide is obtained when silicon is oxidized in an atmosphere of nitrosyl chloride with nitrogen diluted oxygen flow, where the ratio of oxygen to nitrogen is illustratively in the range of 1:16 by volume. The addition of nitrosyl chloride to oxygen at volume ratios of about 1:20 provides, on oxidation of silicon, significant increases in growth rates of silicon dioxide with accompanying improved higher breakdown voltage and reduced number of charge carriers. In general, the growth rate of silicon dioxide is significantly influenced favorably in atmospheres containing oxygen and nitrosyl chloride at volume ratios in the range of about 1:1 to about 20:1. At volume ratios of nitrosyl chloride to oxygen above 1:1, there is no significant improvement in the growth rate of silicon dioxide.

Although temperatures for the oxidation of silicon substrates may vary to some extent, they normally will be between about 900° and 1100° C. However, there are practical limits for the temperatures employed, as for example at temperatures below about 780° C, the decomposition rate of the nitrosyl chloride and the speed of the oxidation reaction are too low to obtain growth rates contemplated in this invention. Illustrative of these significant improvements in growth rate, is that obtained by the oxidation of silicon wafers at a substrate temperature of 1050° C in a gas flow comprised of 20 1/min of nitrogen in combination with 1.3 1/min of oxygen and 0.22 1/min of nitrosyl chloride flowing as a mixture through a reaction tube of about 40 cm$^2$ in cross-section.

Non-limiting examples will be given to illustrate the invention.

It is to be understood that the chemical reaction taking place in the use of nitrosyl chloride, in accordance with this invention, are not accurately known. It is generally believed that nitrosyl chloride decomposes, in an inert atmosphere, above 700° C into active NO and active chlorine particles. However, the significant increases in the growth rate of silicon dioxide is not attributable solely to the presence of the active NO and Cl components, since previous investigations (see for example Ronan et al. above) indicate that the addition of chlorine to dry oxygen provides an increased growth rate of only about 1.7. Also, as discussed by J. A. Aboaf on page 155 of the June 1971 issue of the IBM Technical Disclosure Bulletin, Vol. 14, No. 1, the oxidation rate of silicon in NO is low, so that this component should not account for the significant increases in the growth rate of silicon dioxide obtained in accordance with this invention. Analysis of the reactions indicate that, in this invention, there is an intermediary formation of highly reactive chlorine oxides leading to the significant increases obtained in silicon dioxide growth rates.

In practice, silicon substrates may be supported on inductively heated graphite holders in a quartz reaction tube, or in any conventional reaction chamber provided with quartz windows for observation of the substrates. A gas mixture flow comprised of oxygen and nitrosyl chloride, and preferably nitrogen, is passed over the silicon substrates through the reaction chamber. The substrate holder can be conventionally heated by H.F. coils surrounding the reaction chamber, with substrate temperature measured in the usual manner, such as with an optical pyrometer.

In order to ensure homogeneous and uniform thicknesses of the silicon oxide layers grown simultaneously on a plurality of substrates, in a reaction chamber, the gas mixture is passed in turbulent flow over the substrates, which minimum gas flow will normally be a function of the flow cross-section. The required volume of gas is commonly obtained by diluting the reaction gasses, oxygen and nitrosyl chloride, with an inert carrier gas, such as nitrogen, in the quantity required for turbulent flow. Alternatively, where an inert gas is not employed, the flow rate and quantity of oxygen can be selected so that the oxygen will also function as a carrier for the nitrosyl chloride. It will be appreciated that a too high flow rate must be avoided since reaction gases passing over the heated silicon substrates will have insufficient time to reach their reaction temperatures.

The following non-limiting Examples 1 and 2 are set forth below for purposes of illustrating the invention described herein. The results of these Examples are compared with additional Examples 3 to 5 selected from prior art sources.

In Examples 1 and 2, the reactive atmosphere employed for oxidizing silicon wafers was formed by diluting an oxygen flow with nitrogen in a volume ratio of 1:16 followed by the admixture of nitrosyl chloride in the quantities specified. The wafers employed were P-doped silicon substrates with a diameter of 57mm., a specific resistance of 10 to 20 ohm cm (about $10^{15}$ boron atoms/cm$^3$) and a <100> crystal orientation. The wafers were cleaned in accordance with conventional techniques. The substrate temperature at which thermal oxidation was effected, ranged from 900° to 1100° C.

The thermal oxidation was carried out in a 860mm long horizontal quartz tube of rectangular cross-section having an internal height of 50mm and an internal width of 100mm. One end of the reaction tube was closed with a ground cap to which a gas outlet tube was fused. The other end of the reaction tube was closed-ended to which a gas inlet tube was attached. The substrates were supported in the reaction tube on graphite holder 10mm high and 90mm wide, and provided with a conventional high temperature resistant coating. The graphite susceptor was positioned in the quartz reaction tube so that initial silicon substrate, contacted by the reactive gas flow, was about 350mm from the gas inlet. The gas components (e.g. $O_2$, NOCl and $N_2$) was supplied from individual sources, and merged at the reaction tube inlet. The inductive heat coil enclosed the reaction tube, and the coil length was longer than the substrate holder, but shorter than the reaction tube which protruded out of both ends of the coil. The coil was connected to an HF generator with a 50kw output, with the temperature of the substrate measured by a pyrometer with an accuracy of ± 10° C.

The gas mixture used for oxidation was made up of commercially available gases. The nitrogen carrier and the oxygen had a purity of 99.998%, and the NOCl was used directly from commercially available gas bottles.

Five silicon wafers were processed in each of the first two examples; and the growth rates are average values of the silicon dioxide measured on each of the respective five wafers. For determining the growth rate, the measured layer thickness of the silicon dioxide was divided by the growth time. The layer thickness was determined by an ellipsometer on the basis of the change in the degree of polarization of a polarized light beam reflected on the grown oxide layers.

EXAMPLE I

Substrate temperature: 950° C
Reaction time: 30 minutes
Volume ratio
 oxygen to nitrogen: 1:16
 oxygen to nitrosyl chloride: 1.86:1
Gas flow rate:
 $N_2$: 20 l/min.
 $O_2$: 1.3 l/min.
 NOCl: 0.7 l/min.
Silicon dioxide growth rate: 30 Å/min.

EXAMPLE II

Substrate temperature: 1050° C
Reaction time: 30 minutes
Volume ratio
 oxygen to nitrogen: 1:16
 oxygen to nitrosyl chloride: 5.9:1
Gas flow rate:
 $N_2$: 20 l/min.
 $O_2$: 1.3 l/min.
 NOCl 0.22 /lmin.
Silicon dioxide growth rate: 33 Å/min.

On comparison of the foregoing results with those known from literature, the following conclusions are obtained:

(A) with gas mixtures of Example 2: oxidation medium of oxygen-nitrogen at a volume ratio of 1:16 with the presence of NOCl; temperature of 1050° C; and a reaction temperature of 30 minutes, a silicon dioxide layer was obtained in a thickness of 990 Å

(B) Under the same conditions of Example 2 and "A" above but in the absence of NOCl, a silicon dioxide layer was obtained in only a thickness of 42 Å

On determining the ratio F of the growth rate of silicon dioxide in a $N_2$—$O_2$—NOCl atmosphere to the growth rate of silicon dioxide in only a $N_2$—$O_2$ (16:1) atmosphere, the ratio F is 23.5, i.e. with the addition of NOCl to the $N_2$—$O_2$ mixture, oxidation of silicon proceeds at a rate 20 times more rapidly than oxidation in the absence of NOCl.

With regard to the foregoing, it is noted that growth rates of silicon dioxide are reduced on dilution of the oxygen flow with nitrogen.

EXAMPLE III

The following results were obtained from the information set forth by R. J. Kriegler et al. in the Journal of the Electrochemical Society, Solid State Science and Technology, March 1972, p. 391, FIG. 1:

Oxidation of silicon, in dry oxygen with and without the addition of chlorine or hydrogen chloride, at 1050° C for 30 minute durations.

$O_2$, dry: silicon dioxide layer thickness: 1090Å
$O_2$+2.5% $Cl_2$: silicon dioxide layer thickness: 1725Å, F=1.6
$O_2$+10% HCl: silicon dioxide layer thickness: 1500Å, F=1.4

From the above, it can be seen that the addition of the halogen to oxygen increased the growth rate of silicon dioxide by a factor of only 1.6

EXAMPLE IV

The following results were obtained in accordance with the teachings of German Patent GE-OS No. 2,314,746.

Oxidation of silicon in dry oxygen with the presence of a halogen added in the form of $CCl_4$:
Temperature: 1000° C
Duration
 (Reaction time): 23 minutes
$O_2$, dry, silicon dioxide layer thickness: 330Å
$O_2$=3.75 mole%
$CCl_4$ 15 mole% $Cl_2$ silicon dioxide layer thickness: 560Å

The above shows that the growth rate of silicon dioxide is increased by a factor F=1.7.

EXAMPLE V

The following results were obtained in the use of the oxidation system described in the IBM, TDB, Vol. 17, No. 9, February 1975, page 2664:

Oxidation of silicon wafers in water vapor:
Temperature: 1000° C
Duration
(Oxidation time) 25 minutes
$O_2$, dry: silicon dioxide layer thickness: 383Å
pure $H_2O$(v.) silicon dioxide layer thickness: 2700Å

Oxidation of silicon wafers in the presence of water provided the greatest increase in the growth rate of silicon oxide which is characterized with a growth factor of 7.1. However, as indicated previously, wet oxidation forms oxides of lesser quality as compared to dry oxidation.

While the invention has been particularly shown and described with reference to preferred embodiments thereof, it will be understood by those skilled in the art that changes in form and detail may be made therein without departing from the spirit and scope of the invention.

What is claimed is:

1. A method of thermally oxidizing a silicon substrate comprising:
heating said substrate to elevated temperatures between about 900° to about 1100° C, and
exposing said heated substrate to an atmosphere wherein the gaseous reactants consist essentially of oxygen and nitrosyl chloride in the range of about 1:1 to about 20:1.

2. The method of claim 1 wherein said atmosphere comprises a gas flow over said heated substrates.

3. The method of claim 1 wherein said atmosphere includes an inert gas carrier.

4. The method of claim 3 wherein said gas is nitrogen.

5. The method of claim 4 wherein said atmosphere comprises oxygen and nitrogen in the ratio of about 1:16 by volume.

6. The method of claim 2 wherein said atmosphere includes an inert gas carrier.

7. The method of claim 6 wherein said gas is nitrogen.

8. The method of claim 7 wherein said atmosphere comprises oxygen and nitrogen in the ratio of about 1:16 by volume.

9. The method of claim 8 wherein said substrates are heated to 1050° C in a reaction tube having a cross-section of 40 square centimeters, and said gas flow of said atmosphere comprises 20 liters of nitrogen per minute, 1.3 liters of oxygen per minute, and 0.22 liter of nitrosyl chloride per minute, each flowing through said reaction tube across said substrate.

* * * * *